(12) United States Patent
Takahashi et al.

(10) Patent No.: US 6,456,559 B1
(45) Date of Patent: Sep. 24, 2002

(54) SEMICONDUCTOR INTEGRATED CIRCUIT

(75) Inventors: Hiroyuki Takahashi; Atsushi Nakagawa, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/971,227

(22) Filed: Oct. 4, 2001

(30) Foreign Application Priority Data

Oct. 5, 2000 (JP) ........................................ 2000-306709

(51) Int. Cl.[7] ................................................. G11C 7/00
(52) U.S. Cl. .............................. 365/230.06; 365/189.11
(58) Field of Search ....................... 365/230.06, 189.11, 365/230.03

(56) References Cited

U.S. PATENT DOCUMENTS 5,943,287 A * 8/1999 Ahn et al. ............. 365/230.06

FOREIGN PATENT DOCUMENTS

JP      06-208790      7/1994

* cited by examiner

*Primary Examiner*—Vu A. Le
(74) *Attorney, Agent, or Firm*—Darryl G. Walker

(57) ABSTRACT

A semiconductor integrated circuit including a logic circuit having an insulated gate field effect transistor (IGFET) (352) with a reduced threshold voltage that may compensate for a reduced voltage supply is provided. The IGFET may receive a signal line (340) at a gate terminal and may provide a controllable impedance path between a signal line (320) and a node (ND). The logic circuit may include a stand-by mode in which the IGFET (352) may receive a potential at a source electrode that may be approximately equal to the potential at a drain electrode. In this way, leakage current may be reduced.

20 Claims, 6 Drawing Sheets

(a)

(b)

SEMICONDUCTOR INTEGRATED CIRCUIT

TECHNICAL FIELD

The present invention relates generally to semiconductor integrated circuits and more particularly to a semiconductor integrated circuit having a plurality of inputs such as a decoder circuit of a semiconductor memory.

BACKGROUND OF THE INVENTION

In order to reduce the size of a semiconductor device, such as a dynamic random access memory (DRAM), component density has continued to increase. As the circuit and wiring miniaturization has increased, the demand for lower power consumption has increased. One method of decreasing power consumption has been to decrease the internal power supply voltage used by the on-chip circuitry.

In general, when the power supply voltage is decreased, gate delay time (tpd) increases which decreases the device operation speed. In order to minimize the gate delay time, the threshold voltage of transistors such as metal oxide semiconductor field effect transistors (MOSFET) can be decreased. This can have the affect of increasing transconductance (gm) so the drive strength can be improved. However, when the threshold voltage is made small, sub-threshold current increases which can cause an increase in standby current and power consumption.

An approach directed to improve the sub-threshold current problem has been disclosed in Japanese Patent Laid-Open No. 6-208790 (JP 6-208790) and will be explained with reference to FIG. 9. Referring now to FIG. 9, a circuit schematic diagram illustrating a conventional string of inverters is set forth. Each inverter is configured as a CMOS (complementary metal oxide semiconductor) inverter in which there is a n-type MOSFET and a p-type MOSFET. For example, the initial stage inverter is made up of n-type MOSFET Q1 and p-type MOSFET Q3. The subsequent stage inverter is made up of n-type MOSFET Q2 and p-type MOSFET Q4.

In the string of inverters illustrate in FIG. 9, the threshold voltage of the transistors that are to be turned off during standby have been increased and are larger than the threshold voltage of the transistors that are turned on in standby. In this example, when the semiconductor device is in standby, a logic low is input into the initial stage inverter (Q1 and Q3). In this state, n-type MOSFET Q1 and p-type MOSFET Q4 are turned off. Accordingly, n-type MOSFET Q1 has a threshold voltage VT1 that is set higher than the threshold voltage VT2 of n-type MOSFET Q2. Likewise, p-type MOSFET Q4 has a threshold voltage VT4 that is higher than the threshold voltage VT3 of p-type MOSFET Q3.

In this way, when the input signal of the initial stage inverter (Q1 and Q3) is low, the string of inverters is in the standby state. In this standby state, n-type MOSFET Q1 and p-type MOSFET Q4 are turned off while n-type MOSFET Q2 and p-type MOSFET Q3 are turned on. With p-type transistor Q3 turned on, a low impedance path is created through p-type transistor Q3 to the power supply. However, because n-type MOSFET Q1 has a high threshold voltage VT1, the sub-threshold leakage current is reduced. Thus, the current leaking from the power supply to ground is reduced in the standby state. Because the output of the initial stage inverter (Q1 and Q3) is logic high, n-type MOSFET Q2 is turned on and p-type MOSFET Q4 is turned off. With n-type transistor Q2 turned on, a low impedance path is created through n-type transistor Q2 to the ground potential. However, because p-type MOSFET Q4 has a high threshold voltage VT4, the sub-threshold leakage current is reduced. Thus, the current leaking from the power supply to ground is reduced in the standby state.

However, the approach described in JP 6-208790 can have drawbacks. For example, in the case of a circuit system in which one logic gate drives a plurality of logic gates the gate delay time (tpd) and the stand-by current may not be effectively improved. One such example can be illustrated by considering a decoder of a semiconductor memory.

First, reasons why the gate delay time (tpd) may not be improved will be described.

Referring now to FIG. 10(a), a circuit schematic diagram of a conventional decoder used in a semiconductor memory device is set forth.

The decoder of FIG. 10(a) uses the approach set forth in JP 6-208790. In this case, when the decoder is in the standby state, transistors that are turned off have a high threshold voltage. As illustrated in FIG. 10, inverter 510 is a driver circuit used to drive a block selection line 520. Inverter 530 is a driver circuit used to drive main word line 540. Block selection line 520 and main word line 540 are used to select logic circuit 550. Logic circuit 550 is used to drive a sub-word line. There are a plurality of block selection lines 520 and main word lines 540 disposed perpendicular to each other. A logic circuit 550 is disposed at intersecting points of a main word line 540 and block selection line 520.

Block selection line 520 is connected to a plurality of logic circuits 550 in the column direction. Thus, inverter 510 is configured to drive the plurality of logic circuits 550. Additionally, main word line 540 is connected to a plurality of logic circuits 550 in the row direction. Likewise, inverter 530 is configured to drive the plurality of logic circuits 550.

Inverters (510 and 530) each drive a plurality of logic circuits 550, however, only the logic circuit 550 that receives a high logic level from block selection line 520 and main word line 540 is selected. Logic circuits 550 that receive a low logic level from either block selection line 520 or main word line 540 are in a non-selection state.

Logic circuit 550 consists of a NAND gate 551 and an inverter 552 that are together configured to produce a logical AND output of the signals received on the block selection line 520 and main word line 540. NAND gate 551 receives block selection line 520 and main word line 540 and produces an output that is received as an input of inverter 552. Inverter 552 produces an output that is a sub-word line signal.

Referring now to FIG. 10(b), a circuit schematic diagram of NAND 551 is set forth. NAND 551 is a CMOS NAND gate that has p-type MOSFETs (5511 and 5512) and n-type MOSFETs (5513 and 5514). P-type MOSFET 5511 has a source connected to a power supply, a drain connected to an output, and a gate connected to block selection line 520. P-type MOSFET 5512 has a source connected to a power supply, a drain connected to an output, and a gate connected to main word line 540. N-type MOSFET 5513 has a source connected to a drain of n-type MOSFET 5514, a drain connected to the output and a gate connected to block selection line 5513. N-type MOSFET 5514 has a source connected to ground and a gate connected to main word line 540.

In the conventional decoder as illustrated in FIG. 10, p-type MOSFET 5511 and n-type MOSFET 5513 will be switched in a complementary fashion in accordance with the signal level on block selection line 520. Likewise, p-type MOSFET 5512 and n-type MOSFET 5514 will be switched in a complementary fashion in accordance with the signal level on main word line 540.

The gate capacitance of a MOSFET is significantly larger when the MOSFET is turned on than when it is turned off. Block selection line 520 is connected to a plurality of logic circuits 550. Because block selection line 520 is connected to a p-type MOSFET 5511 and a n-type MOSFET 5513, there is always a MOSFET that is turned on. When block selection line 520 is low, p-type MOSFET 5511 is turned on and has increased capacitance. When block selection line 520 is high, n-type MOSFET 5513 is turned on and has increased capacitance. Thus, the capacitive load on block selection line 520 is always relatively large. This can increase the gate delay time of inverter 520 and can affect the overall circuit operating speed.

Additionally, when the threshold voltage of a MOSFET is decreased to compensate for a decreased power supply potential, the particular MOSFET turns on more quickly when the switching signal transitions thereby increasing the gate capacitance earlier. This can increase the total charge needed to drive the gate of the MOSFET and further decrease the logic gate delay time (tpd). Thus, when using the conventional approach in a circuit such as a decoder, for example, the logic gate delay time (tpd) is not effectively improved when the threshold voltage of a MOSFET is decreased to compensate for a decreased power supply potential.

The reason why the stand-by current may not be improved will now be described.

In the conventional decoder configuration illustrated in FIG. 10, the circuit may be in a stand-by condition when block selection line 520 is low. However, main word line 540 can be high. In this case, n-type MOSFET 5513 is turned off and p-type MOSFET 5511 is turned on. Also, p-type MOSFET 5512 is turned off and n-type MOSFET 5514 is turned on. Thus, a potential difference equivalent to the power supply is applied between the drain and source of n-type MOSFET 5513. This can cause a sub-threshold current to flow from the power supply to ground through n-type MOSFET 5513. In the case of a semiconductor memory, the row decoder includes a plurality of logic circuits 550, thus, even if the threshold voltage of the transistor that is turned off in stand-by is relatively high, it is problematic to effectively improve the stand-by current.

In view of the above discussion, it would be desirable to provide a semiconductor integrated circuit that can effectively improve the gate delay time even if the threshold voltage of a transistor is decreased in conjunction with a decreased in the power supply potential. It would also be desirable to effectively decrease the stand-by current even if the threshold voltage of a transistor is decreased in conjunction with a decreased in the power supply potential. It would also be desirable to provide these improvements in a circuit such as a decoder in a semiconductor memory in which one driver circuit drives a plurality of logic circuits.

SUMMARY OF THE INVENTION

According to the present embodiments, a semiconductor integrated circuit may include a logic circuit having a insulated gate field effect transistor (IGFET) with a reduced threshold voltage that may compensate for a reduced voltage supply is provided. The IGFET may receive a signal line at a gate terminal and may provide a controllable impedance path between a signal line and a node. The logic circuit may include a stand-by mode in which the IGFET may receive a potential at a source electrode that may be approximately equal to the potential at a drain electrode. In this way, leakage current may be reduced.

According to one aspect of the embodiments, a semiconductor integrated circuit may include a plurality of logic circuit coupled to receive a first signal line from a first drive circuit. Each logic circuit may include a first conductivity type IGFET having a first threshold voltage, a second first conductivity type IGFET having a second threshold voltage, and an output node. The first threshold voltage may be smaller than the second threshold voltage. The first conductivity type IGFET may have a gate electrode coupled to receive the first signal line and may provide a first controllable impedance path between one of a plurality of second signal lines and the output node.

According to another aspect of the embodiments, each logic circuit may include a load device coupled between a power supply and the output node and provide charge to the output node.

According to another aspect of the embodiments, when the logic circuit is in a non-selected state, the first conductivity type IGFET may have a potential difference between a source electrode and a drain electrode that may be less than the first threshold voltage.

According to another aspect of the embodiments, when the logic circuit is in a non-selected state, the first conductivity type IGFET may have a potential at a source electrode that may be substantially equal to a potential at a drain electrode.

According to another aspect of the embodiments, each logic circuit may include an inverter having an input coupled to receive the output node. The inverter may include a first conductivity type IGFET and a second conductivity type IGFET. The second conductivity type IGFET may have a threshold voltage that may be higher than a typical second conductivity type IGFET.

According to another aspect of the embodiments, each second signal line may be driven to a maximum voltage of approximately the power supply minus the first threshold voltage by one of a plurality of second drive circuits.

According to another aspect of the embodiments, each second signal line may be driven by one of a plurality of second drive circuits. Each second drive circuit may include a first conductivity type IGFET and a second conductivity type IGFET arranged to form an inverter driving the second signal line. The first drive circuit may include a first conductivity type IGFET and a second conductivity type IGFET arranged to form an inverter driving the first signal line. The second conductivity type IGFET in the first drive circuit may have a higher threshold voltage than a typical second conductivity type IGFET on the semiconductor integrated circuit. The first conductivity type IGFET in the second drive circuit may have a higher threshold voltage than a typical first conductivity type IGFET on the semiconductor integrated circuit According to another aspect of the embodiments, the plurality of logic circuits may be coupled to receive a third signal line from a third drive circuit. Each logic circuit may include a first conductivity type IGFET having a gate electrode coupled to receive the third signal line and providing a second controllable impedance path between the first controllable impedance path and the output node.

According to another aspect of the embodiments, a connection node between the first conductivity type IGFETs may be charged by a charging IGFET, which may prevent a floating condition.

According to another aspect of the embodiments, a semiconductor integrated circuit may include a first signal line disposed perpendicularly to a second signal line. A logic circuit may include a first conductivity type IGFET having a control gate coupled to the first signal line and providing a first controllable impedance path between the second signal line and a charge node. A second conductivity type IGFET may be coupled between a first reference potential and the charge node and may provide charge to the charge node. The first conductivity type IGFET may have a threshold voltage that may be lower than the threshold voltage of a typical first conductivity type IGFET on the semiconductor integrated circuit According to another aspect of the embodiments, in a standby mode of operation, the first signal line may be at a first logic level and the second signal line may be at a second logic level.

According to another aspect of the embodiments, the first logic level may be a low logic level and the second logic level may be a high logic level. The first conductivity type may be n-type.

According to another aspect of the embodiments, a first drive circuit may include a second conductivity type IGFET. The second conductivity type IGFET may have a controllable impedance path coupled between the first reference potential and the first signal line. The second conductivity type IGFET may have a threshold voltage that may be higher than a typical second conductivity type IGFET on the semiconductor integrated circuit. A second drive circuit may include a first conductivity type IGFET. The first conductivity type IGFET may have a controllable impedance path coupled between a second reference potential and the second signal line. The first conductivity type IGFET may have a threshold voltage that may be higher than a typical first conductivity type IGFET on the semiconductor integrated circuit.

According to another aspect of the embodiments, the semiconductor integrated circuit may include a standby mode in which the charge node has essentially the same potential as the second signal line.

According to another aspect of the embodiments, the logic circuit may include a second conductivity type IGFET having a gate coupled to receive the charge node and may provide a controllable impedance path between the first reference potential and a logic circuit output node. The second conductivity type IGFET may have a threshold voltage that may be greater than a typical second conductivity type IGFET on the semiconductor integrated circuit.

According to another aspect of the embodiments, a semiconductor integrated circuit may include a first signal line disposed perpendicularly to a plurality of second signal lines. The semiconductor integrated circuit may include a plurality of logic circuits and a plurality of second signal drive circuits. Each logic circuit may include a first IGFET of a first conductivity type and having a control gate coupled to receive the first signal line and may provide a controllable impedance path between a logic circuit node and one of the plurality of second signal lines. Each second signal drive circuit may include a first second signal drive IGFET of the first conductivity type having a controllable impedance path coupled between a first reference potential and one of the plurality of second signal lines. The first IGFET may have a threshold voltage that is lower than the threshold voltage of the first second signal drive IGFET.

According to another aspect of the embodiments, each second signal drive circuit may be coupled to receive a chip select signal.

According to another aspect of the embodiments, the semiconductor integrated circuit may be a semiconductor memory device including a plurality of sub-word lines. Each logic circuit may have a logic circuit output coupled to one of the plurality of sub-word lines.

According to another aspect of the embodiments, the plurality of logic circuits may be coupled to provide sub-word lines associated with a first sub-array. A third signal line may be disposed perpendicularly to the plurality of second signal lines. The semiconductor integrated circuit may include a second plurality of logic circuits. Each logic circuit may include the first IGFET of a first conductivity type and having a control gate coupled to receive the third signal line and providing a controllable impedance path between the logic circuit node and one of the plurality of second signal lines. The second plurality of logic circuits may be coupled to provide sub-word lines associated with a second sub-array.

According to another aspect of the embodiments, the semiconductor integrated circuit may be an dynamic random access memory and the first and second signal lines may include decoded address information.

DETAILED DESCRIPTION OF THE EMBODIMENTS

Various embodiments of the present invention will now be described in detail with reference to a number of drawings.

Embodiment 1

Figure 1:
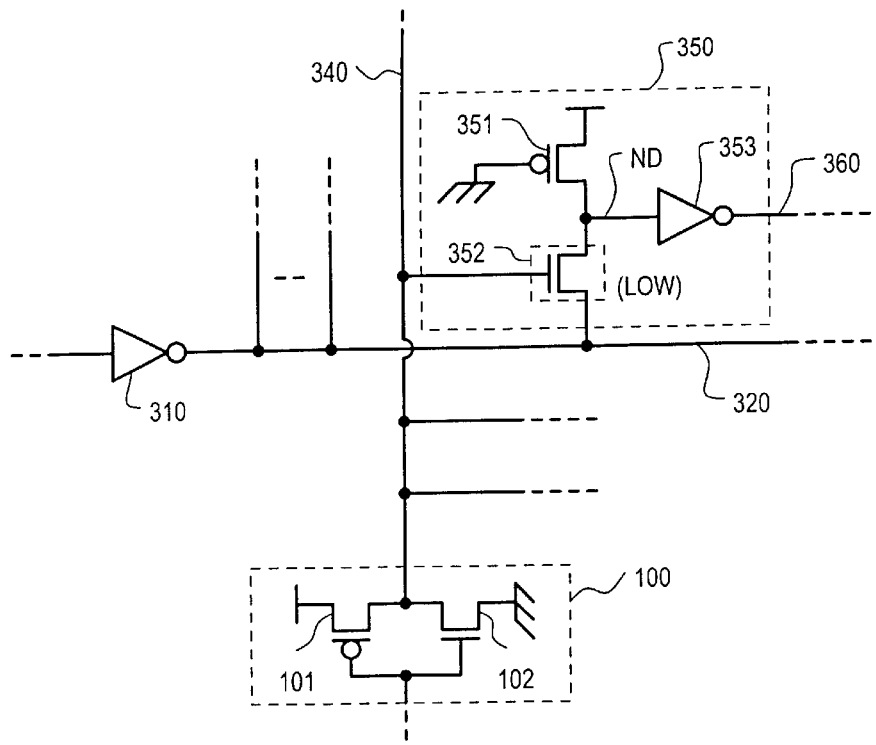
FIG. 1 is a schematic diagram of a semiconductor integrated circuit in accordance with a first embodiment.

Referring now to FIG. 1, a schematic diagram of a semiconductor integrated circuit in accordance with a first embodiment is set forth.

The semiconductor integrated circuit of FIG. 1 may be a decoder used in a semiconductor memory. The decoder may include a plurality of logic circuits that may be similar to logic circuit 350. Logic circuits (such as logic circuit 350) may include a group that is in a selection state and a group that is in a non-selection state in accordance with the value of address signals received.

The semiconductor memory circuit of FIG. 1 may include a drive circuit 100, a drive circuit 310, and a logic circuit 350. Drive circuit 100 may drive a signal line 340. Signal line 340 may be used for block selection in a semiconductor memory. Signal line 340 may be connected as an input to a plurality of logic circuits (such as logic circuit 350) in a column direction. Drive circuit 310 may drive a signal line 320. Signal line 320 may be a main word line in a semiconductor memory. Signal line 320 may be connected as an input to a plurality of logic circuits (such as logic circuit 350) in a row direction.

Drive circuit 100 may include a p-type IGFET (insulated gate field effect transistor) 101 and a n-type IGFET 102. P-type IGFET 101 may have a source connected to a power supply, a drain connected to signal line 340, and a gate connected to receive an input signal. N-type IGFET 102 may have a source connected to ground, a drain connected to signal line 340, and a gate commonly connected to the gate of p-type IGFET 101 to receive the input signal.

Drive circuit 310 may drive signal line 320. Signal line 320 and signal line 340 are disposed so as to perpendicularly cross each other in an area in which logic circuit 350 may be disposed. In this way, signal line 320 may provide one input to logic circuit 350 and signal line 340 may provide another input to logic circuit 350.

A group of logic circuits (such as logic circuit 350) may be commonly connected to signal line 340. When signal line 340 is in a selection state (in this case logic high), one of the logic circuits (such as logic circuit 350) may be selected based on a main word line (such as signal line 320). It is noted that there may be a plurality of signal lines 320 running in the row direction. Likewise, there may be a plurality of signals lines 340 running in the column direction.

Thus, a decoder as in FIG. 1, may be configured so that a drive circuit 100 drives a plurality of logic circuits 350. When signal line 340 is high, the logic circuits 350 are divided into those under a selection state and those under a non-selection state.

Logic circuit 350 may be a sub-word driving circuit and may drive a sub-word line 360. Logic circuit 350 may include a p-type IGFET 351, a n-type IGFET 352, and an inverter 353. P-type IGFET 351 may have a source connected to a power supply, a drain connected to node ND, and a gate connected to ground. N-type IGFET 352 may have a source connected to signal line 320, a drain connected to node ND, and a gate connected to signal line 340. N-type IGFET 352 may have a reduced threshold voltage. Inverter 353 may have an input connected to node ND and an output connected to sub-word line 360.

P-type IGFET 351 may always be turned on and may act as a load to charge node ND during a pre-charge operation. N-type IGFET 352 may act to discharge node ND whenever logic circuit 350 is selected.

By providing n-type IGFET 352 with a reduced threshold voltage, the operating margin of logic circuit 350 may be improved when the power supply voltage is reduced. Also, the transconductance of n-type IGFET 352 is improved. Thus, even if the gate width of n-type IGFET 352 is designed to be relatively small, the current drive capabilities may be maintained. For the first embodiment, the reduction of the threshold voltage of n-type IGFET 352 allows the gate width of n-type IGFET 352 to be relatively small so that the gate area and capacitance may be reduced.

The operation of the first embodiment will now be described.

Initially, a low level may be applied to the input of drive circuit 310. As a result, signal line 320 may be high. Also, a high level may be applied to the input of drive circuit 100. As a result, signal line 340 may be low. With signal line 340 low, n-type IGFET 352 may be turned off (non-selection state). Because n-type IGFET 352 is turned off, the capacitance of the gate of n-type IGFET 352 may be approximately 40 percent smaller than when the n-type IGFET 352 is turned on. Also, because the gate area of the n-type IGFET 352 may be small, the capacitive load on signal line 340 may have a reduced value.

Thus, in a non-selected logic circuit 350, the potential difference between the source electrode and gate electrode of n-type IGFET 352 may be less than the threshold voltage (VTN1) of n-type IGFET 352. Also, by applying a high level to signal line 320, the potential at the source electrode and drain electrode of n-type IGFET 352 may be approximately equal. In this way, sub-threshold leakage current may be eliminated. It is noted that p-type IGFET 351 may act as a load device and may keep node ND at a high level when n-type IGFET 352 is turned off.

Next, an address may be received by decoders (not shown) and, in accordance with the address value, drive circuit 310 may drive a signal line (such as signal line 320) to the low level. In one contiguous group of logic circuits connected to drive circuit 100, there may be only one signal line 320 out of a plurality of signal lines 320 that may become low. Also, approximately at this time, drive circuit 100 may drive signal line 340 high. Because the capacitive load of signal line 340 is in a reduced capacitance state as discussed above, drive circuit 100 may drive signal line 340 at a relatively high speed.

When signal line 320 at a low level and signal line 340 at a high level, n-type IGFET 352 may be turned on. In this way, the low level of signal line 320 may be applied to pull node ND to a low level. Thus, sub-word line 360 may be pulled high and a row of memory cells connected to sub-word line 360 may be selected.

It is noted that only one of the plurality of logic circuits 350 connected to signal line 340 may have a n-type IGFET 352 that is tuned on. This is because only one of the plurality of logic circuits 350 may have a n-type IGFET 352 that receives a low level signal line 320 at the source terminal. With the source of n-type IGFET 352 of non-selected logic circuits 350 at a high level, the potential of thee gate of the n-type IGFET 352 of non-selected logic circuits 350 may not become a threshold voltage above the source potential. It is noted, that the drain (node ND) of the n-type IGFET 352 in each non-selected logic circuit 350 remains pulled to the high level by p-type IGFET 351. Thus, the selected logic circuit 350 may have a n-type IGFET 352 that is turned on and has the increased gate capacitance. By this, the drive circuit 100 may always drive signal line 350 at a relatively high speed, and the gate delay time (tPD) may be reduced.

By reducing the capacitance load on signal line 340 as described above, the driving capability of drive circuit 100 may be adjusted. In this way, gate widths of IGFETs (101 and 102) may be reduced. This can reduce the capacitance load on the signal input into drive circuit 100. Thus, the delay time of the signal input into drive circuit 100 may be reduced and the overall speed path of the semiconductor integrated circuit may be improved.

Figure 2:
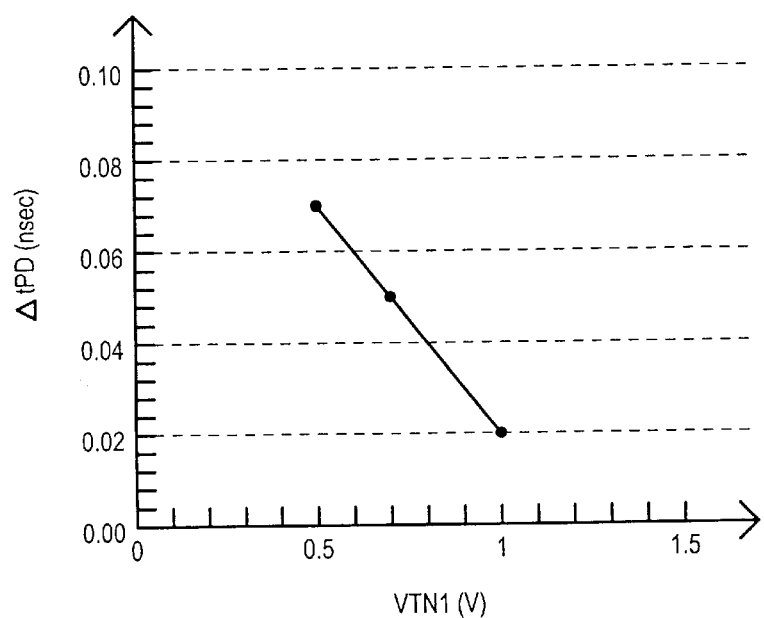
FIG. 2 is a graph illustrating the relationship between the threshold voltage (VTN1) of a n-type IGFET of a logic circuit and the deviation of the gate delay time $\Delta tPD$.

Referring now to FIG. 2, a graph illustrating the relationship between the threshold voltage (VTN1) of n-type IGFET 352 and the deviation of the gate delay time ΔtPD is set forth. In the graph illustrated in FIG. 2, the threshold voltage of n-type IGFET 352 of logic circuit 350 is illustrated in the horizontal axis. The deviation ΔtPD of the gate delay time is illustrated in the vertical axis and is a reduction of the signal propagation time from the input portion of the drive circuit 100 to the input portion of inverter 353. As illustrated in the graph, as the threshold voltage (VTN1) is lowered, the gate delay time (tPD) can be reduced.

As illustrated in the configuration of embodiment 1, the threshold voltage (VTN1) of n-type IGFET 352 may be reduced. In this way, the operating margin of logic circuit 350 may be improved. This improvement may allow a sufficient operating margin when there is a reduction in a power supply potential. In this way, lower power supply voltages may be used.

Additionally, the gate width and therefore gate area of n-type IGFET 352 may be reduced. This may provide a decreased gate capacitance. The configuration of logic circuit 350 may enable the majority of the plurality of logic circuits 350 to have an n-type IGFET that is turned off. This may allow a reduced capacitive load on signal line 340. In the example illustrated with embodiment 1, only one of the plurality of logic circuits 350 connected to signal line 340 may have a n-type IGFET that is turned on. In this way, drive circuit 100 may rapidly drive signal line 340 and the signal delay time may be reduced.

In response to the reduction in the capacitive load on signal line 340, the gate width of IGFETs (101 and 102) in drive circuit 100 may be reduced. In this way, the speed of the signal propagation within the semiconductor integrated circuit may be improved.

Also, the potential of the source and drain of n-type IGFET 352 in non-selected logic circuits 350 may be approximately equal. In this way, sub-threshold current may be reduced thereby effectively reducing overall current consumption. Also, in standby operation, the potential of the source and drain of n-type IGFET 352 in all logic circuits 350 may be approximately equal, which may reduce stand-by current consumption.

Embodiment 2

Figure 3:
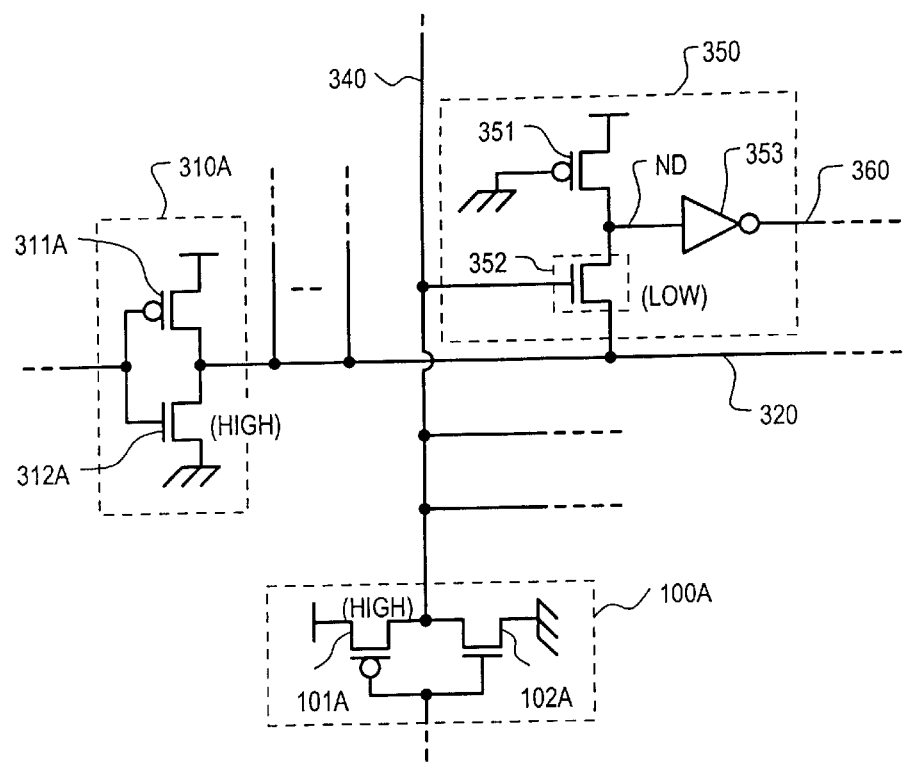
FIG. 3 is a schematic diagram of a semiconductor integrated circuit in accordance with a second embodiment.

Referring now to FIG. 3, a schematic diagram of a semiconductor integrated circuit in accordance with a second embodiment is set forth.

The semiconductor integrated circuit of FIG. 3 may be similar to the semiconductor integrated circuit of FIG. 1, except drive circuits (100A and 310A) may be used to replace drive circuits (100 and 310).

Drive circuit 310A may include an inverter having p-type IGFET 311A and n-type IGFET 312A. P-type IGFET 311A may have a source connected to a power supply, a drain connected to signal line 320, and a gate connected to receive an input signal. N-type IGFET 312A may have a source connected to ground, a drain connected to signal line 320, and a gate connected to receive the input signal. N-type IGFET 312A may have a threshold voltage that is higher than a normal n-type IGFET.

Drive circuit 100A may include a p-type IGFET (insulated gate field effect transistor) 101A and a n-type IGFET 102A. P-type IGFET 101A may have a source connected to a power supply, a drain connected to signal line 340, and a gate connected to receive an input signal. P-type IGFET 101A may have a threshold voltage that is higher than a normal p-type IGFET. N-type IGFET 102A may have a source connected to ground, a drain connected to signal line 340, and a gate commonly connected to the gate of p-type IGFET 101A to receive the input signal.

The operation of the second embodiment will now be described.

In the configuration of the second embodiment illustrated in FIG. 3, drive circuit 310A may include a n-type IGFET 312A with a higher than normal threshold voltage. This may increase the input threshold voltage of the inverter configured drive circuit 310A. In this way, signal line 320 may be driven from low to high more rapidly. Also, drive circuit 100A may include a p-type IGFET 10A with a higher than normal threshold voltage. This may decrease the input threshold voltage of the inverter configured drive circuit 100A. In this way, signal line 340 may be driven from high to low more rapidly.

By improving the speed in which signal line 340 is driven low and the speed in which signal line 320 is driven high, logic circuit 350 may be placed into the non-selected state more rapidly. In this way, the risk of selecting multiple sub-word lines 360 may be alleviated.

Additionally, in a stand-by state, signal line 320 may be driven to a high level by drive circuit 310A and signal line 340 may be driven to a low level by drive circuit 10A. In this state, logic circuit 350 may be in a non-selection state and sub-threshold current in n-type IGFET 352 may be reduced. This may be accomplished by turning off n-type IGFET 352 while applying essentially the same potential to the source and drain of n-type IGFET 352. By doing so, stand-by current consumption by logic circuit 350 may be reduced.

Also, during the stand-by state, a low potential may be applied to the input of drive circuit 310A. Thus, p-type IGFET 311A may be turned on and n-type IGFET 312A may be turned off. In this case, the power supply potential may be applied to the drain of n-type IGFET 312A while the ground potential may be applied to the source. However, because n-type IGFET 312A has a high threshold voltage, the sub-threshold current may be reduced. As such, stand-by current consumption may be reduced.

Likewise, during the stand-by state, a high potential may be applied to the input of drive circuit 100A. Thus, p-type IGFET 101A may be turned off and n-type IGFET 102A may be turned on. In this case, the power supply potential may be applied to the source of p-type IGFET 101A while the ground potential may be applied to the drain. However, because p-type IGFET 101A has a high threshold voltage, the sub-threshold current may be reduced. As such, stand-by current consumption may be reduced.

Thus, according to Embodiment 2, stand-by current in drive circuits (10A and 310A) may be reduced.

Embodiment 3

Figure 4:
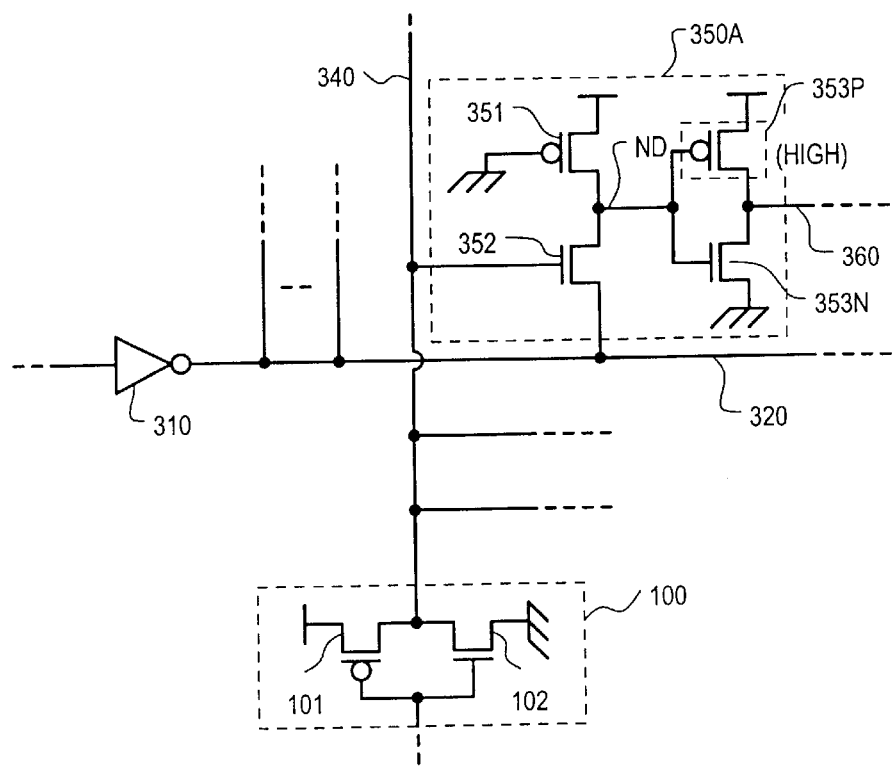
FIG. 4 is a schematic diagram of a semiconductor integrated circuit in accordance with a third embodiment.

Referring now to FIG. 4, a schematic diagram of a semiconductor integrated circuit in accordance with a third embodiment is set forth.

In the semiconductor integrated circuit of embodiment 3, leakage current in a logic circuit may be reduced.

The semiconductor integrated circuit of FIG. 4 may be similar to the semiconductor integrated circuit of FIG. 1, except logic circuit 350A may be used to replace logic circuit 350.

Logic circuit 350A may include n-type IGFETs (352 and 353N) and p-type IGFETs (351 and 353P). P-type IGFET 351 may have a source connected to a power supply, a drain connected to node ND, and a gate connected to ground. N-type IGFET 352 may have a source connected to signal line 320, a drain connected to node ND, and a gate connected to signal line 340. N-type IGFET 353N may have a source connected to ground, a drain connected to sub-word line 360, and a gate connected to node ND. P-type IGFET 353P may have a source connected to a power supply, a drain connected to sub-word line 360, and a gate connected to node ND. P-type IGFET 353P may have an increased threshold voltage. N-type IGFET 353N and p-type IGFET 353P may collectively operate as an inverter receiving node ND as an input and providing sub-word line 360 as an output. By providing p-type IGFET 353P with an increased threshold voltage, sub-threshold current may be reduced.

The operation of the third embodiment will now be described.

In a stand-by state, signal line 340 may be low and signal line 320 may be high. With signal line 340 at a low level, n-type IGFET 352 may be turned off. Node ND may be kept high by p-type IGFET 351 which may act as a load device. In this way, the source and drain terminals of n-type IGFET 352 may have essentially the same potential and subthreshold current may be reduced.

With node ND at a high level, p-type IGFET 353P may be turned off and n-type IGFET 353N may be turned on. In this way, sub-word line 360 may be at a low level. Thus, the source of p-type IGFET 353P may be at a power supply potential and the drain may be at a ground potential. However, because p-type IGFET 353P may have a high threshold voltage, the sub-threshold current may be reduced.

As illustrated in the third embodiment, sub-threshold current may be reduced in logic circuit 350A. This may apply to both a stand-by state and a non-selection state during reading and/or writing of data to a memory.

Embodiment 4

Figure 5:
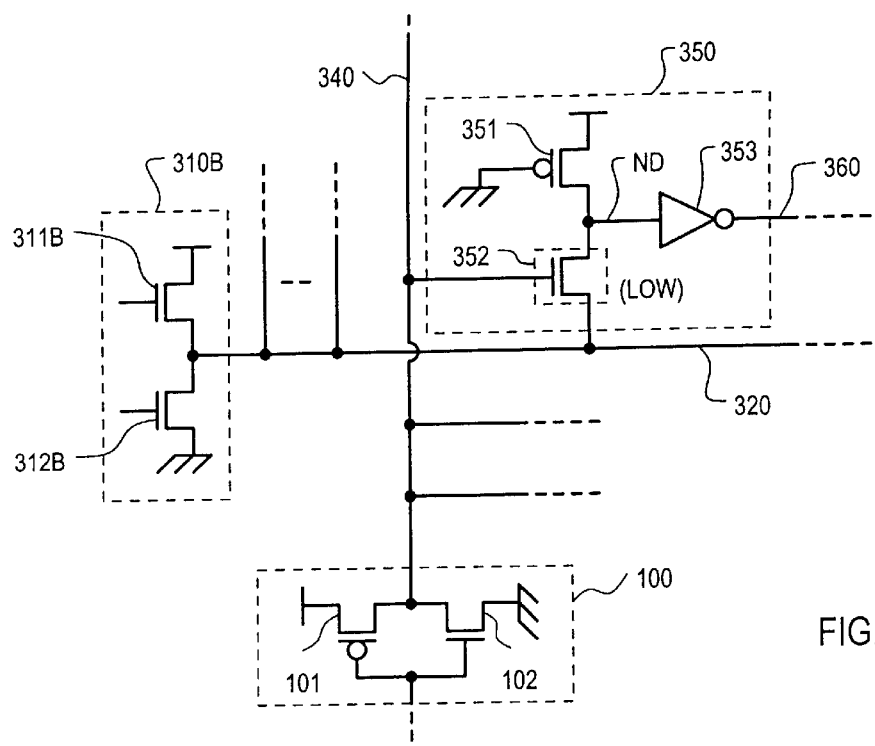
FIG. 5 is a schematic diagram of a semiconductor integrated circuit in accordance with a fourth embodiment.

Referring now to FIG. 5, a schematic diagram of a semiconductor integrated circuit in accordance with a fourth embodiment is set forth.

The semiconductor integrated circuit of FIG. 5 may be similar to the semiconductor integrated circuit of FIG. 1, except drive circuit 310B may be used to replace drive circuit 310.

Drive circuit 310B may include n-type IGFET 311B and n-type IGFET 312B. N-type IGFET 311B may have a drain connected to a power supply, a source connected to signal line 320, and a gate connected to an input signal. N-type IGFET 312B may have a drain connected to signal line 320, source connected to ground, and a gate connected to an input signal.

Drive circuit 310B may receive input signals at the gates of n-type IGFETs (311B and 312B), respectively, that may be complementary. N-type IGFETs (311B and 312B) may constitute an inverter, which may provide a signal on signal line 320. The signal provided on signal line 320 may have a reduced voltage swing in that a high level may have a voltage drop by the threshold voltage of n-type IGFET 311B. The threshold voltage of n-type IGFET 311B may be approximately the same as the threshold voltage of n-type IGFET 352 in logic circuit 350.

The operation of the fourth embodiment will now be described.

When the gate of n-type IGFET 311B is at a high level, n-type IGFET 311B may be turned on. At the same time, the gate of n-type IGFET 312B may be at a low level and n-type IGFET 312B may be turned off. In this way, signal line 320 may be at a power supply potential minus a threshold voltage of n-type IGFET 311B or VDD–$V_{TN}$.

The potential (VDD–$V_{TN}$) on signal line 320 may be applied to the source of n-type IGFET 352 in logic circuit 350. Because the threshold voltage of n-type IGFET 352 is approximately equal to the threshold voltage of n-type IGFET 311B, the potential difference between the gate and the source of n-type IGFET 352 may be approximately equal to the threshold voltage of n-type IGFET 352. Thus, n-type IGFET 352 may be turned off.

When the gate of n-type IGFET 311B is at a low level, n-type IGFET 311B may be turned off. At the same time, the gate of n-type IGFET 312B may be at a high level and n-type IGFET 312B may be turned on. In this way, signal line 320 may be at a low level. In this state, embodiment 4 may operate in a similar manner to embodiment 1 and embodiment 2.

In embodiment 4, as illustrated in FIG. 5, signal line 320 may be limited to a power supply minus a threshold voltage when at a high level. Thus, when drive circuit 310B drives signal line 320 from a high level to a low level, signal line 320 may transition from VDD–$V_T$ to ground, as compared to from VDD to ground. In this way, the switching time of signal line 320 from a high level to a low level may be reduced.

Also, in accordance with embodiment 4, with signal line 320 having a voltage swing less than rail to rail, less charge may be consumed in switching the potential of signal line between a high level and a low level. In this way, power consumption may be reduced. Also, noise caused by current switching may be reduced.

Embodiment 5

Figure 6A:
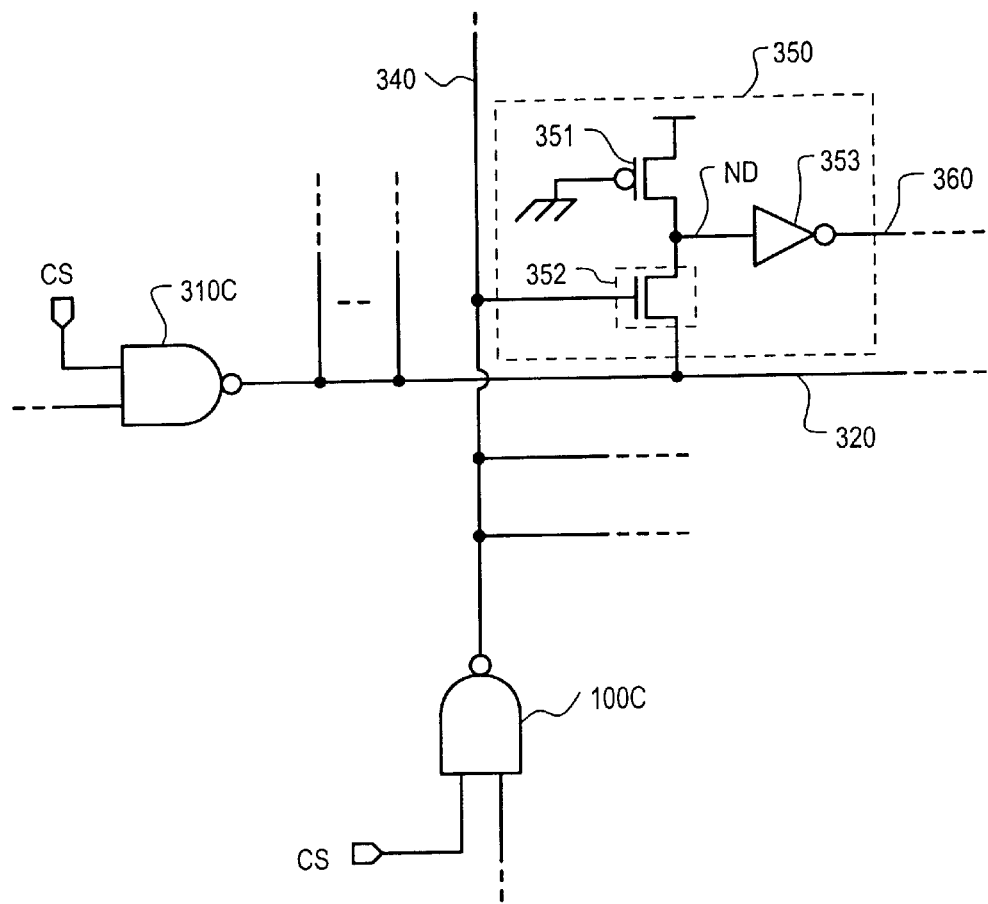
FIG. 6(a) is a schematic diagram of a semiconductor integrated circuit in accordance with a fifth embodiment.

Referring now to FIG. 6(a), a schematic diagram of a semiconductor integrated circuit in accordance with a fifth embodiment is set forth.

The semiconductor integrated circuit of FIG. 6(a) may be similar to the semiconductor integrated circuit of FIG. 1, except NAND gate 310C may be used to replace drive circuit 310 and NAND gate 100C may be used to replace drive circuit 100.

NAND gate 310C may receive an input signal and a chip select signal CS as inputs and may have an output connected to signal line 320. NAND gate 100C may receive an input signal and chips select signal CS as inputs and may have an output connected to signal line 340.

Figure 6B:
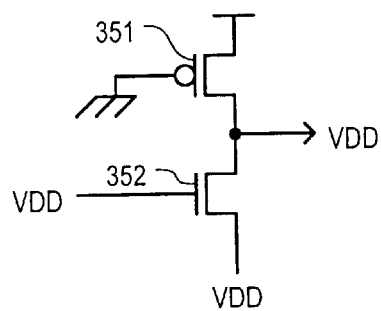
FIG. 6(b) is a circuit schematic diagram illustrating the condition of a portion of a logic circuit in the stand-by condition.

In a stand-by condition, chip select signal CS may be low. With chip select CS low, NAND gate 100C may produce a high level at signal line 340 and NAND gate 310C may produce a high level at signal line 320. Referring now to FIG. 6(b), a circuit schematic diagram illustrating the condition of a portion of logic circuit 350 in the stand-by condition is set forth. As illustrated in FIG. 6(b), when chip select CS is low, a high potential (VDD) may be applied to the source and gate of n-type IGFET 352 by NAND gates (310C and 100C), respectively. Also, p-type IGFET 351 may apply a high potential (VDD) to the drain of n-type IGFET 352. In this way the gate, drain, and source terminal of n-type IGFET 352 may be at essentially the same potentials.

Under this bias condition, the potential difference between the gate and the source electrodes of n-type IGFET 352 may be essentially zero and n-type IGFET 352 may be turned off. Also, because the potential difference between the drain and gate electrodes of n-type IGFET 352 may be essentially zero, no electric filed may be formed between these electrodes. This may reduce band-to-band tunneling. Also, the potential difference between the drain and source electrodes of n-type IGFET 352 may be essentially zero, thus, sub-threshold currents flowing through n-type IGFET 352 may be essentially zero.

According to the fifth embodiment illustrated in FIG. 6(a), logic circuits (such as logic circuit 350) may be placed in a bias condition such that n-type IGFET 352 may have terminals with similar potentials and stand-by current may be reduced.

Embodiment 6

Figure 7:
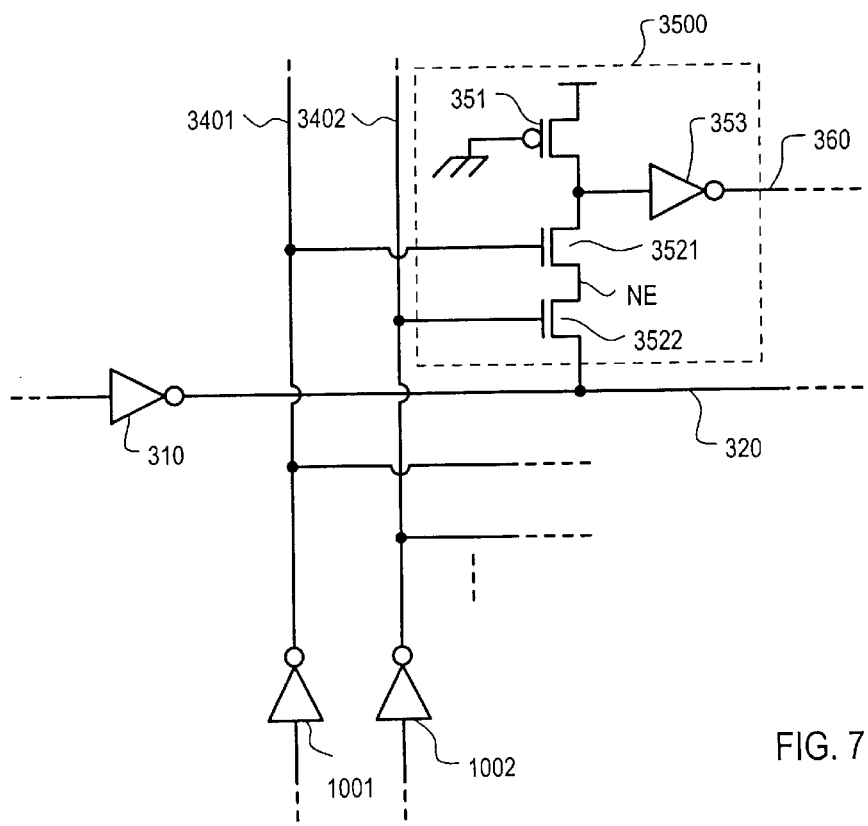
FIG. 7 is a schematic diagram of a semiconductor integrated circuit in accordance with a sixth embodiment.

Referring now to FIG. 7, a schematic diagram of a semiconductor integrated circuit in accordance with a sixth embodiment is set forth.

The semiconductor integrated circuit of FIG. 7 may include similar constituents to the semiconductor integrated circuit of FIG. 1, as such similar constituents may be referred to by the same general reference character.

Also, the semiconductor integrated circuit of FIG. 7 may include a logic circuit 3500 that may have three inputs as opposed to logic circuit 350 in the semiconductor integrated circuit of FIG. 1 which may only have two inputs.

The semiconductor integrated circuit of FIG. 7 may include driver circuits (1001 and 1002). Driver circuit 1001 may receive an input and may have an output connected to signal line 3401. Driver circuit 1002 may receive an input and may have an output connected to signal line 3402. The input signals to driver circuits (1001 and 1002) may include address information for selecting a memory cell, as just one example.

Logic circuit 3500 may include a p-type IGFET 351, n-type IGFETs (3521 and 3522), and an inverter 353. P-type IGFET 351 may have a source connected to a power supply, a drain connected to an input of inverter 353 and a gate connected to ground. N-type IGFET 3521 may have a drain connected to an input of inverter 353, a source connected to node NE, and a gate connected to signal line 3401. N-type IGFET 3522 may have a drain connected to node NE, a source connected to signal line 320, and a gate connected to signal line 3402. Inverter 353 may have an input connected to a drain of p-type IGFET 351 and a drain of n-type IGFET 3521 and an output connected to sub-word line 360.

When drive circuits (1001 and 1002) respectively drive signal lines (3401 and 3402) to a high level and drive circuit 310 drives signal line 320 to a low level, logic circuit 3500 may be in a selected state. In this case, n-type IGFETs (3521 and 3522) may be turned on and a low level may be applied from signal line 320 to the input of inverter 353. In this way, sub-word line 360 may become high. When input signals cause other levels to be applied to signal lines (3401, 3402, and 310) logic circuit 3500 may be in a non-selected state.

When in the non-selected state and both signal lines (3401 and 3402) are at the low level, n-type IGFETs (3521 and 3522) may be turned off. In this case, node NE may be floating and the potential may be unknown. Thus, a potential difference between a gate of either n-type IGFET 3521 or n-type IGFET 3522 and node NE (which may be considered a source of transistors (3521 and 3522)) may become greater than a threshold voltage. Thus, a n-type IGFET (3521 or 3522) may be turned on. When a n-type IGFET (3521 or 3522) is turned on, the respective gate capacitance may increase and the propagation delay of the respective signal line (3401 or 3402) may increase.

Figure 8:
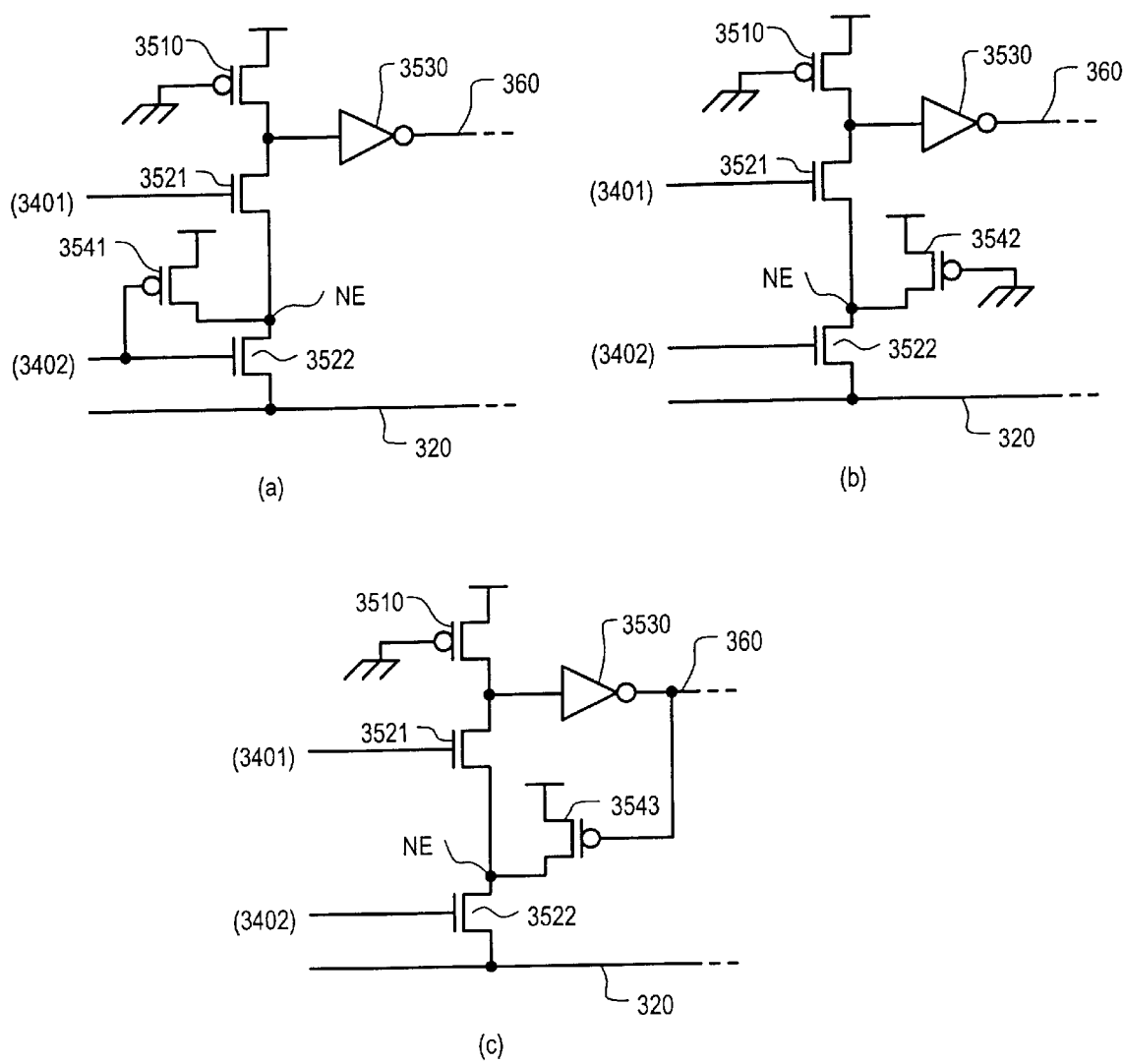
FIGS. 8(a)–(c) are circuit schematic diagrams illustrating configurations for a logic circuit.
Figure 9:
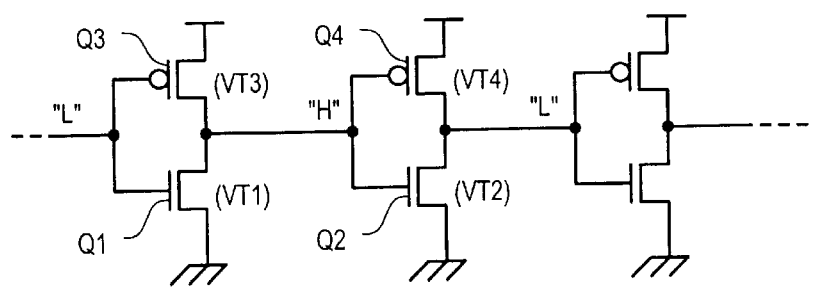
FIG. 9 is a circuit schematic diagram illustrating a conventional string of inverters.
Figure 10:
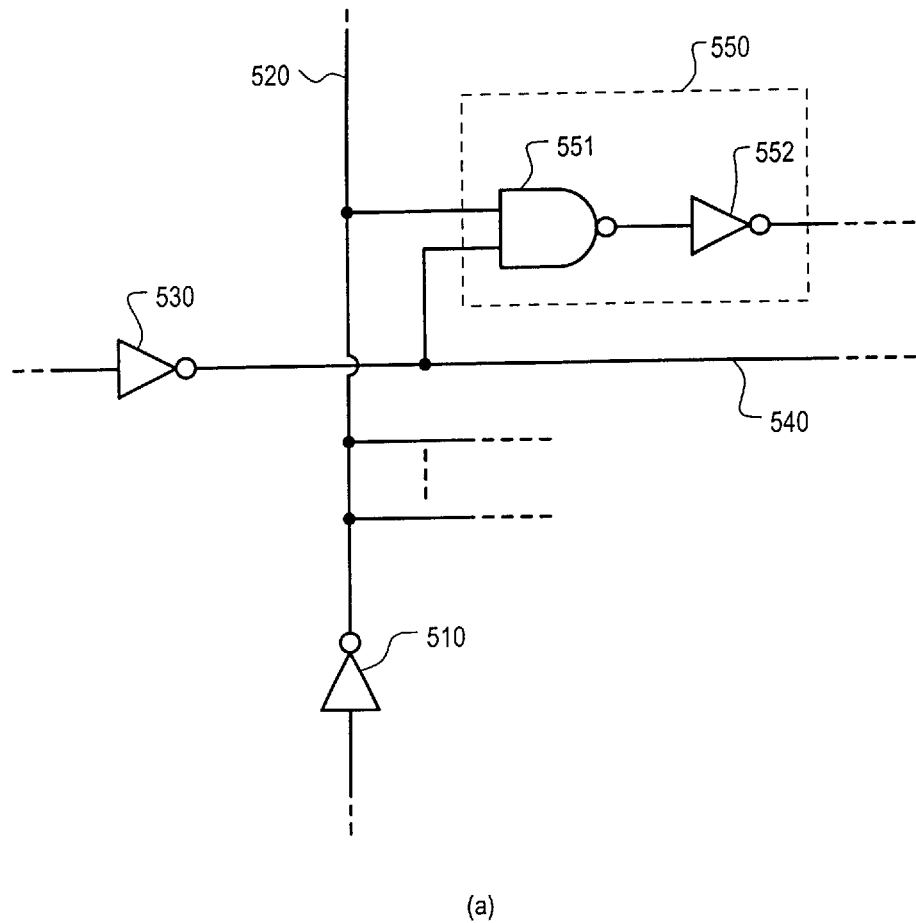
FIG. 10(a) is a circuit schematic diagram of a conventional decoder used in a semiconductor memory device.
FIG. 10(b) is a circuit schematic diagram of a conventional NAND gate.
Figure 10:
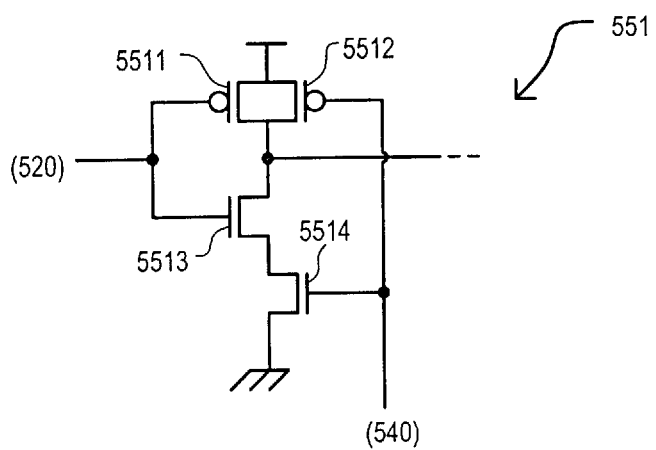

Referring now to FIG. 8(a)–(c), circuit schematic diagrams illustrating configurations for logic circuit 3500 is set forth.

The logic circuits illustrated in FIG. 8(a)–(c) may be used to prevent the floating state of node NE. In this way, IGFETs (3521 and 3522) may remain in the low gate capacitance state when desired.

Logic circuits illustrated in FIG. 8(a)–(c) may respectively include a p-type IGFET (3541 to 3543) that may be connected to node NE to prevent the floating condition.

The logic circuit illustrated in FIG. 8(a) may include a p-type IGFET 3541 having a source connected to a power supply, a drain connected to node NE and a gate connected to signal line 3402 and the gate of n-type IGFET 3522. Thus, when a low level is applied to the gate of n-type IGFET 3522 through signal line 3402, p-type IGFET 3541 may be turned on and node NE may be charged and clamped to a high level. Thus, the case in which signal lines (3401 and 3402) are low and both n-type IGFETs (3521 and 3522) are turned off and node NE is floating may be effectively eliminated. Thus, under these conditions signal lines (3401 and 3402) may remain in a relatively low load capacitance state.

The logic circuit illustrated in FIG. 8(b) may include a p-type IGFET 3542 having a source connected to a power supply, a drain connected to node NE and a gate connected to ground. Thus, p-type IGFET 3542 may be always turned on and node NE may be charged to a high level. Thus, the case in which signal lines (3401 and 3402) are low and both n-type IGFETs (3521 and 3522) are turned off and node NE is floating may be effectively eliminated. Thus, under these conditions signal lines (3401 and 3402) may remain in a relatively low load capacitance state.

P-type IGFET 3542 may have a small current driving capability so that n-type IGFET 3522 may easily pull node NE to a low level when turned on and signal line 320 is at a low level. Also, because the gate of p-type IGFET 3542 may not be connected to a signal line (3401 or 3402), the capacitive load of a signal line (3401 or 3402) may not be affected.

The logic circuit illustrated in FIG. 8(c) may include a p-type IGFET 3543 having a source connected to a power supply, a drain connected to node NE and a gate connected to the output of inverter 3530. When either signal line (3401 or 3402) are at a low level, either n-type IGFET 3521 or 3522 may be turned off accordingly and p-type IGFET 3510 may provide a high level at the input of inverter 3530. With a high level as an input, inverter 3530 may provide a low output. Thus, when a low level is applied to the gate of either n-type IGFET 3521 or 3522 through signal line 3401 or 3402, p-type IGFET 3543 may be turned on and node NE may be charged and clamped to a high level. Thus, the case in which signal lines (3401 and 3402) are low and both n-type IGFETs (3521 and 3522) are turned off and node NE is floating may be effectively eliminated. Thus, under these conditions signal lines (3401 and 3402) may remain in a relatively low load capacitance state.

P-type IGFET 3543 may have a small current driving capability so that n-type IGFET 3522 may easily pull node NE to a low level when turned on and signal line 320 is at a low level. Also, because the gate of p-type IGFET 3543 may not be connected to a signal line (3401 or 3402), the capacitive load of a signal line (3401 or 3402) may not be affected. Also, when the logic circuit illustrated in FIG. 8(c) is in the selected state, the output of inverter 3530 may become high and p-type IGFET 3543 may be turned off. Thus, current consumption during the selected state may not be adversely affected.

It is understood that the embodiments described above are exemplary and the present invention should not be limited to those embodiments. Specific structures should not be limited to the described embodiments.

For example, in the first embodiment, p-type IGFET 351 may be used as a load device, however, an n-type IGFET may also be used as a load device, as just one example. Also, n-type IGFET 352 may be used as a drive device, logic circuit 350 may be configured so that a p-type IGFET may be used as a drive device, as just one example.

In the first embodiment, n-type IGFET 352 may be one of a plurality of n-type IGFETs in series connected between node ND and signal line 352. In this case, a plurality of decoded signals such as signal line 340 may be used as inputs to logic circuit 350, as just one example. Likewise, p-type IGFETs may be used, as just one example.

In the embodiments, such as embodiment 1, logic circuit 350 may have been configured to allow potentials to the source and drain electrodes of a turned off IGFET to be approximately the same. However, these potentials may only need to be in a range in which the IGFET may have a reduced sub-threshold current as desired.

In the embodiments, such as embodiment 2, the threshold voltages of n-type IGFET 312A and p-type IGFET 101A may be higher than normal. However, such an embodiment may also include IGFETs (such as p-type IGFET 311A and n-type IGFET 102A) in which threshold voltages are made lower than normal. In this way, drive circuit threshold voltages may be further modified as desired.

In the embodiments, such as embodiment 4, n-type IGFET 311B may operate as a source follower. However, drive circuit 310B should not be limited as such. For example, a p-type IGFET having a source connected to a power supply, and a drain and gate connected to signal line 320 may be used or a n-type IGFET having a drain and gate connected to a power supply, and a source connected to signal line 320 may be used, as just two examples. In this way, signal line 320 may still have a reduced voltage swing. The reduced voltage swing may be determined by a device threshold voltage.

In the embodiments, such as embodiment 5, in the stand-by state, a power supply voltage may be applied to the drain, gate, and source electrodes of an IGFET, such as n-type IGFET 352. However, it may be desirable to apply a voltage in a range such that subthreshold current may be reduced as desired.

In the embodiments, an IGFET may be used as a load (for example p-type IGFET 351), in such a case the gate may be receive a voltage that allows the load to supply charge to a desired node. However, a signal may be applied such that the load may only supply charge to the desired node during a predetermined period, as just one example. Also, other device elements, such as a resistive device, may be used as a load.

While the embodiments have been illustrated in which input signals have been applied to the source and gate of n-type IGFET (for example n-type IGFET 352) in logic circuit 350, logic circuit 350 may be configured so that input signals may be applied to the source and gate of a p-type IGFET, as just one example.

IGFETs illustrated in the embodiments may be metal oxide semiconductor field effect transistors (MOSFETs), as just one example.

A memory device incorporating the embodiments may include multiple sub-arrays of memory cells, such that signal line 320 may be a main word line that may be connected to at least one logic circuit 350, in a sub-array. There may be a plurality of main word lines disposed in parallel over a plurality of sub-arrays arranged in a row direction. Signal line 340 may be a block decode line that may be connected to a plurality of logic circuits 350 in a sub-array. Each sub-array may be selected by a predetermined signal line 340. An active signal line 340 and an active signal line 320 may activate a logic circuit 350 to select a sub-word line 360. Only one sub-word line 360 may be activated in a sub-array at a particular time. A sub-word line 360 may select a row or memory cells in the sub-array.

In the embodiments according to this invention, the threshold voltage of an IGFET receiving input signals at a gate and source terminal, respectively, maybe decreased to compensate for a reduced power supply potential. Stand-by currents may be suppressed even in an IGFET having a reduced threshold voltage.

Signal lines may be connected to the gate electrode of selected IGFETs in a plurality logic circuits. These selected IGFETs may be biased so that they are turned off. This may reduce the gate capacitance values. By reducing capacitive loading on signal lines, signal propagation times may be improved.

In a stand-by or non-activated state, a selected IGFET in a logic circuit may be biased so that drain and source electrodes may have approximately the same potential. In this way, sub-threshold currents may be reduced when the IGFET is turned off. This can reduce stand-by current.

Also, selected IGFETs may have an increased threshold voltage. In this way, leakage current may be reduced. Threshold voltages of logic gates may be modified by increasing a threshold voltage of selected transistors. In this way, predetermined signal propagation speeds may be increased so that erroneous selection states may not occur.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor integrated circuit, comprising:
    a plurality of logic circuits coupled to receive a first signal line from a first drive circuit, each logic circuit includes a first first conductivity type insulated gate field effect transistor (IGFET) having a first threshold voltage, a second first conductivity type IGFET having a second threshold voltage, and an output node, the first threshold voltage is smaller than the second threshold voltage; and
    wherein the first first conductivity type IGFET has a gate electrode coupled to receive the first signal line and provides a first controllable impedance path between one of a plurality of second signal lines and the output node.

2. The semiconductor integrated circuit according to claim 1, wherein:
    each logic circuit further includes a load device coupled between a power supply and the output node and providing charge to the output node.

3. The semiconductor integrated circuit according to claim 1, wherein:
    when the logic circuit is in a non-selected state the first first conductivity type IGFET has a potential difference between a source electrode and a drain electrode that is less than the first threshold voltage.

4. The semiconductor integrated circuit according to claim 1, wherein:
    when the logic circuit is in a non-selected state the first first conductivity type IGFET has a potential at a source electrode that is substantially equal to a potential at a drain electrode.

5. The semiconductor integrated circuit according to claim 1, wherein:
each logic circuit further including an inverter having an input coupled to receive the output node;
the inverter includes a third first conductivity type IGFET and a first second conductivity type IGFET and first second conductivity type IGFET has a threshold voltage that is higher than a typical second conductivity type IGFET on the semiconductor integrated circuit.

6. The semiconductor integrated circuit according to claim 1, wherein:
each second signal line is driven to a maximum voltage of approximately a power supply minus the first threshold voltage by one of a plurality of second drive circuits.

7. The semiconductor integrated circuit according to claim 1, wherein:
each second signal line is driven by one of a plurality of second drive circuits;
each second drive circuit includes a second drive first conductivity type IGFET and a second drive second conductivity type IGFET arranged to form an inverter driving the second signal line;
the first drive circuit includes a first drive first conductivity type IGFET and a first drive second conductivity type IGFET arranged to form an inverter driving the first signal line; and
the first drive second conductivity type IGFET has a higher threshold voltage than a typical second conductivity type IGFET on the semiconductor integrated circuit and the second drive first conductivity type IGFET has a higher threshold voltage than a typical first conductivity type IGFET on the semiconductor integrated circuit.

8. The semiconductor integrated circuit according to claim 1, wherein:
the plurality of logic circuits coupled to receive a third signal line from a third drive circuit; and
each logic circuit further includes a second first conductivity type IGFET having a gate electrode coupled to receive the third signal line and providing a second controllable impedance path between the first controllable impedance path and the output node.

9. The semiconductor integrated circuit according to claim 8, further including:
a connection node between the first first conductivity type IGFET and second first conductivity type IGFET; and
a charging IGFET coupled to provide charge to the connection node to prevent a floating condition.

10. A semiconductor integrated circuit, comprising:
a first signal line disposed perpendicularly to a second signal line;
a logic circuit including a first first conductivity type IGFET having a control gate coupled to the first signal line and providing a first controllable impedance path between the second signal line and a charge node;
a first second conductivity type IGFET coupled between a first reference potential and the charge node and providing charge to the charge node;
wherein the first first conductivity type IGFET has a first threshold voltage that is lower than the threshold voltage of a typical first conductivity type IGFET on the semiconductor integrated circuit.

11. The semiconductor integrated circuit according to claim 10, wherein:
in a standby mode of operation, the first signal line is at a first logic level and the second signal line is at a second logic level.

12. The semiconductor integrated circuit according to claim 11, wherein:
the first logic level is a low logic level, the second logic level is a high logic level, and the first conductivity type is a n-type.

13. The semiconductor integrated circuit according to claim 12, further including:
a first drive circuit including a second second conductivity type IGFET having a controllable impedance path coupled between the first reference potential and the first signal line wherein the second second conductivity type IGFET has a second threshold voltage that is higher than a typical second conductivity type IGFET on the semiconductor integrated circuit; and
a second drive circuit including a second first conductivity type IGFET having a controllable impedance path coupled between a second reference potential and the first signal line wherein the second first conductivity type IGFET has a third threshold voltage that is higher than the typical first conductivity type IGFET on the semiconductor integrated circuit.

14. The semiconductor integrated circuit according to claim 10, wherein:
the semiconductor integrated circuit includes a standby mode in which the charge node has essentially the same potential as the second signal line.

15. The semiconductor integrated circuit according to claim 10, wherein:
the logic circuit includes a second second conductivity type IGFET having a gate coupled to receive the charge node and providing a controllable impedance path between the first reference potential and a logic circuit output node wherein the second second conductivity type IGFET has a second threshold voltage that is greater than a typical second conductivity type IGFET on the semiconductor integrated circuit.

16. A semiconductor integrated circuit, comprising:
a first signal line disposed perpendicularly to a plurality of second signal lines;
a plurality of logic circuits, each logic circuit including a first IGFET of a first conductivity type and having a control gate coupled to receive the first signal line and providing a controllable impedance path between a logic circuit node and one of the plurality of second signal lines;
a plurality of second signal drive circuits, each second signal drive circuit including a first second signal drive IGFET of the first conductivity type having a controllable impedance path coupled between a first reference potential and one of the plurality of second signal lines;
wherein the first IGFET has a first threshold voltage that is lower than a second threshold voltage of the first second signal drive IGFET.

17. The semiconductor integrated circuit according to claim 16, wherein:
each second signal drive circuit is coupled to receive a chip select signal.

18. The semiconductor integrated circuit according to claim 16, wherein the semiconductor integrated circuit is a semiconductor memory device further comprising:

a plurality of sub-word lines;

each logic circuit has a logic circuit output coupled to one of the plurality of sub-word lines.

19. The semiconductor integrated circuit according to claim 18, further including:

the plurality of logic circuits is a first plurality of logic circuits coupled to provide sub-word lines associated with a first sub-array;

a third signal line disposed perpendicularly to the plurality of second signal lines;

a second plurality of logic circuits, wherein in the second plurality of logic circuits each logic circuit including the first IGFET of a first conductivity type and having a control gate coupled to receive the third signal line and providing a controllable impedance path between the logic circuit node and one of the plurality of second signal lines; and the second plurality of logic circuits coupled to provide sub-word lines associated with a second sub-array.

20. The semiconductor circuit according to claim 16, wherein:

the semiconductor integrated circuit is a dynamic random access memory device and the first and second signal lines include decoded address information.

* * * * *